United States Patent
Yang et al.

(10) Patent No.: US 7,963,244 B2
(45) Date of Patent: Jun. 21, 2011

(54) ELECTROSTATIC COATING APPARATUS

(75) Inventors: Sen-Yeu Yang, Taipei (TW); Tzu-Chien Huang, Taipei (TW); Hsin-Chun Lai, Taipei (TW); Guan-Nan Lu, Taipei (TW)

(73) Assignee: National Taiwan University, Taipei (TW)

( * ) Notice: Subject to any disclaimer, the term of this patent is extended or adjusted under 35 U.S.C. 154(b) by 317 days.

(21) Appl. No.: 12/239,101

(22) Filed: Sep. 26, 2008

(65) Prior Publication Data

US 2010/0006027 A1    Jan. 14, 2010

(30) Foreign Application Priority Data

Jul. 11, 2008 (TW) .............................. 97126228 A

(51) Int. Cl.
*B05B 5/025* (2006.01)

(52) U.S. Cl. ........ 118/629; 118/621; 239/698; 239/704; 239/707; 239/708

(58) Field of Classification Search .......... 118/620–640; 427/457–486; 239/692, 701–704, 690, 697, 239/550, 556, 557, 566, 707, 708; 361/228, 361/235; 250/550, 556, 557, 566
See application file for complete search history.

(56) References Cited

U.S. PATENT DOCUMENTS

| 4,955,960 | A | | 9/1990 | Behr et al. | |
|---|---|---|---|---|---|
| 5,735,958 | A | * | 4/1998 | Mauchle | 118/621 |
| 5,916,640 | A | * | 6/1999 | Liu et al. | 427/475 |
| 6,060,128 | A | * | 5/2000 | Kim et al. | 427/483 |
| 2004/0177807 | A1 | * | 9/2004 | Pui et al. | 118/303 |

FOREIGN PATENT DOCUMENTS

TW           156501        4/1991

* cited by examiner

*Primary Examiner* — Yewebdar T Tadesse
(74) *Attorney, Agent, or Firm* — Muncy, Geissler, Olds & Lowe, PLLC

(57) ABSTRACT

An electrostatic coating apparatus for coating an object includes a base module, a nozzle, an electric field generator and a power supply. The object is mounted on the base module. The nozzle receives gas and liquid and ejects the gas and the liquid. The electric field generator mounted on the base module generates an electric field. The power supply has a first pole electrically connected to a first pole of the electric field generator, and a second pole electrically connected to the object and a second pole of the electric field generator such that the electric field is generated in the electric field generator and the atomized liquid passing through the electric field generator is charged and absorbed onto the object to form a coating layer on the object.

18 Claims, 3 Drawing Sheets

US 7,963,244 B2

ELECTROSTATIC COATING APPARATUS

This application claims priority of No. 097126228 filed in Taiwan R.O.C. on Jul. 11, 2008 under 35 USC 119, the entire content of which is hereby incorporated by reference.

BACKGROUND OF THE INVENTION

1. Field of Invention

The invention relates to an electrostatic coating apparatus, and more particularly to an electrostatic coating apparatus for coating an object according to an electrostatic principle.

2. Related Art

At present, the coating methods adopted in the opto-electronic and semiconductor industry include a spin coating method, a roller coating method and a dip coating method. The spin coating method is mainly to coat a photoresist onto a substrate, wherein the availability of the photoresist is about 10%, so the other 90% of the photoresist are treated as a waste material. Thus, the material is wasted, and the environmental problem is caused because a lot of solvents have to be used for rinsing. The roller coating method is to coat the material onto the substrate using a roller. The dip coating method is to dip the substrate into the coating material and then take the substrate out. Although the dip coating method can form the coating layer having the thickness ranging from about 3 to 12 microns, this coating method cannot satisfy the requirement of precise coating in the formation of the micro-structure or the transfer printing with the nanometer level.

Thus, it is an important subject of the invention to provide an electrostatic coating apparatus capable of solving the above-mentioned problems.

SUMMARY OF THE INVENTION

It is therefore an objective of the invention to provide an electrostatic coating apparatus for controlling a uniform thickness of a coated film according to the principles of the electrostatic charge and the voltage field.

The invention achieves the above-identified objective by providing an electrostatic coating apparatus for coating an object. The electrostatic coating apparatus includes a base module, a nozzle, an electric field generator and a power supply. The object is mounted on the base module. The nozzle receives gas and liquid and ejects the gas and the liquid. The electric field generator mounted on the base module generates an electric field. The power supply has a first pole electrically connected to a first pole of the electric field generator, and a second pole electrically connected to the object and a second pole of the electric field generator such that the electric field is generated in the electric field generator and the atomized liquid passing through the electric field generator is charged and absorbed onto the object to form a coating layer on the object.

According to the electrostatic coating apparatus of the invention, the thickness of the coating layer can be controlled by controlling the electric field so that the uniformity of the coating layer can be enhanced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

The principle of electrostatic coating is mainly based of the law of conservation of charge, which means that the free charges may be transferred between objects and can neither be increased nor diminished. When the object is electrified to have the same positive and negative charges, the object has the charge neutrality. When the positive charges of the object or the negative charges of the object are not the same, the object becomes a charged body. Thus, the invention provides an electrostatic coating apparatus capable of making the fog drops of atomized photoresist or the fog drops of other materials pass through an electric field. The so-called electric field represents a spatial field of force around each charge or a group of charges and has the unit of measurement (Newton/Coulombs) corresponding to the force of each charge. The externally applied electric field can charge the fog drops of atomized photoresist to become the positively charged body so that the fog drops are absorbed onto the grounded roller.

Figure 1:
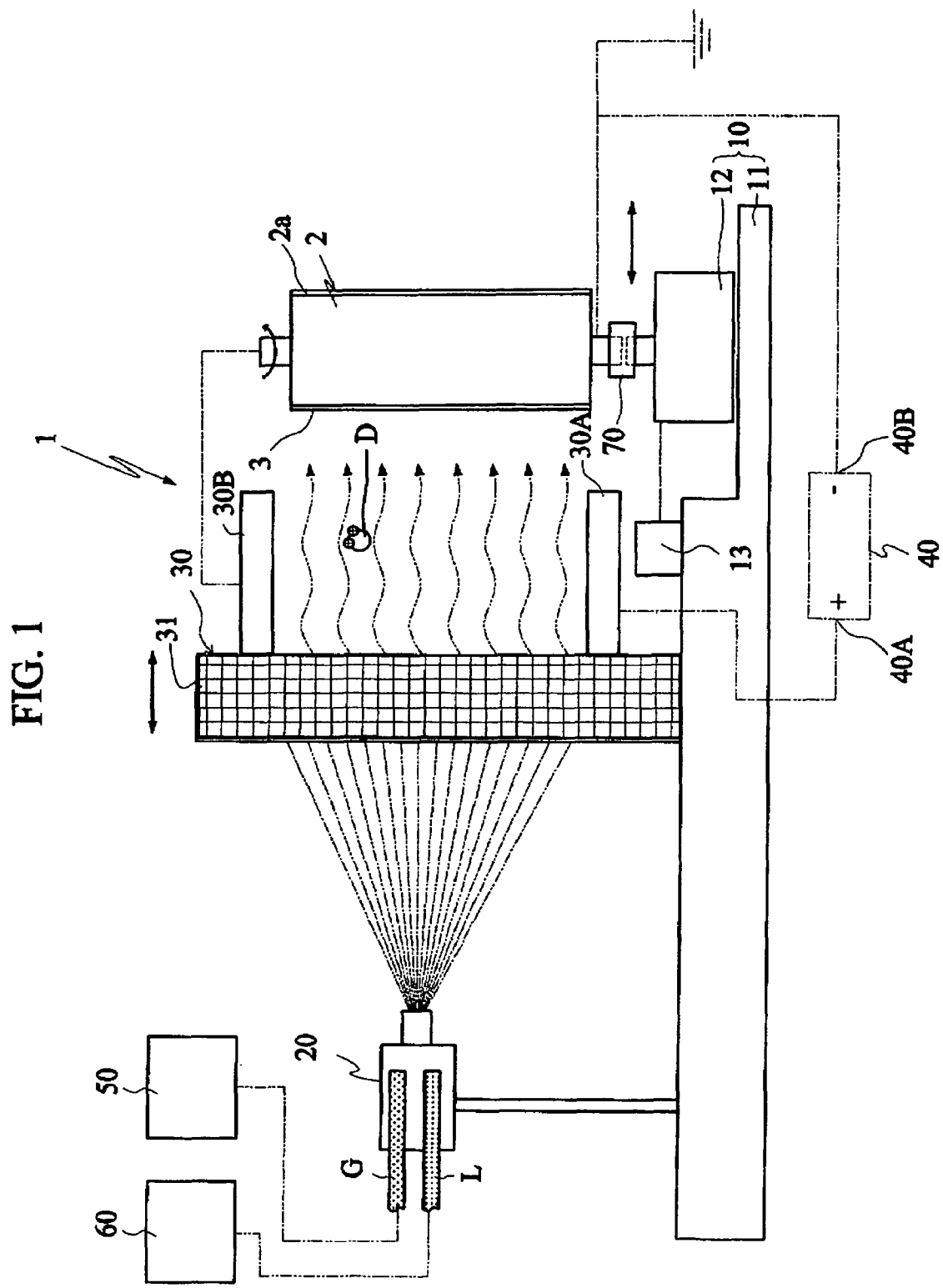
FIG. 1 is a schematic illustration showing an electrostatic coating apparatus according to a first embodiment of the invention.

FIG. 1 is a schematic illustration showing an electrostatic coating apparatus 1 according to a first embodiment of the invention. As shown in FIG. 1, the electrostatic coating apparatus 1 of this embodiment is for coating an object 2, which may be a conductor or a non-conductor as long as it can be electrified. In this embodiment, the object 2 is a roller, and the material of the roller includes nickel or stainless steel.

The electrostatic coating apparatus 1 includes a base module 10, a nozzle 20, an electric field generator 30 and a power supply 40.

The object 2 is mounted on the base module 10. The base module 10 may include a single base or a plurality of bases and a combination of other structures or members. In this embodiment, the base module 10 includes a base 11 and a motor 12. The object 2 is mounted on the base 11 through the motor 12. The motor 12 is coupled to the object 2 through a coupler 70 to drive the object 2 to rotate. In addition, in order to facilitate the adjustment of the physical parameters, the base module 10 may further include a distance adjusting mechanism 13, coupled to the motor 12 or the electric field generator 30, for adjusting a distance between the object 2 and the electric field generator 30. The distance adjusting mechanism 13 may be, for example, a combination of a screw rod and a nut, a combination of a worm wheel and a worm shaft, or a combination of a cam and a follower, or the like.

The nozzle 20 receives gas G and liquid L and ejects the gas G and the liquid L. Thus, the electrostatic coating apparatus 1 may further include a gas supplying source 50 and a liquid supplying source 60, which are connected to the nozzle 20 and respectively provide the gas G and the liquid L. The liquid L includes a photoresist material, and the gas G includes nitrogen or air, which is preferably highly compressed. Although the nozzle 20 can atomize the liquid L, the electric field generator 30 of this embodiment may further have a mesh structure 31 for further atomizing the liquid L to make the liquid L become finer. When the nozzle 20 has the very strong atomizing function, the mesh structure 31 may be omitted.

The electric field generator 30, mounted on the base module 10 and disposed downstream of the nozzle 20, generates an electric field.

The electric field generator 30 mounted on the base module 10 generates an electric field.

The power supply 40 has a first pole 40A and a second pole 40B. The power supply 40 provides a direct current (DC) voltage. The first pole 40A of the power supply 40 is electrically connected to a first pole 30A of the electric field generator 30. The first pole 30A and a second pole 30B of the electric field generator 30 are respectively a first polar plate and a second polar plate, or are respectively a wire and a polar plate. The second pole 40B of the power supply 40 is electrically connected to the object 2 and the second pole 30B of the electric field generator 30. In this embodiment, the second pole 40B is electrically connected to the second pole 30B through the object 2. Thus, the electric field can be generated in the electric field generator 30 so that the liquid L passing through the electric field generator 30 is charged and absorbed onto the object 2 to form a coating layer 3 on a circumferential surface 2a of the rotating roller 2.

Specifically speaking, the lower first polar plate 30A is electrified to have the positive charges, and the upper second polar plate 30B is grounded. Thus, the electric field may be generated between the first polar plate 30A and the second polar plate 30B. The atomized photoresist enters the electric field, and the positive charges temporarily stay on the surface of the fog drop D, as shown in FIG. 1 in the exaggerated manner. Due to the driving of the gas flow field, the kinetic energy for moving the fog drop D between the first polar plate 30A and the second polar plate 30B toward the roller is greater than the kinetic energy, generated by the electrostatic charges, for moving the fog drop D toward the second polar plate 30B. After the fog drop D reaches the grounded roller 2, the photoresist can be coated on the roller.

In this embodiment, the thickness of the coating layer 3 may be controlled by adjusting the intensity of the electric field. According to the experiment, it is found that the electrostatic coating apparatus 1 of this embodiment may be configured such that the thickness of the coating layer 3 is smaller than or equal to 30 nanometers, or preferably ranges between 20 and 30 nanometers. Thus, the electrostatic coating apparatus 1 of the invention can be applied to the manufacturing of the nanometer structure or the transfer printing according to the coating layer having the uniform thickness. It is to be noted that the coating layer of the roller manufactured according to the method of the invention can be applied to the manufacturing of the surface structure of the roller, and the micro/nano structure may be directly formed on the roller according to the photo-lithography process and the surface coating process.

Figure 2:
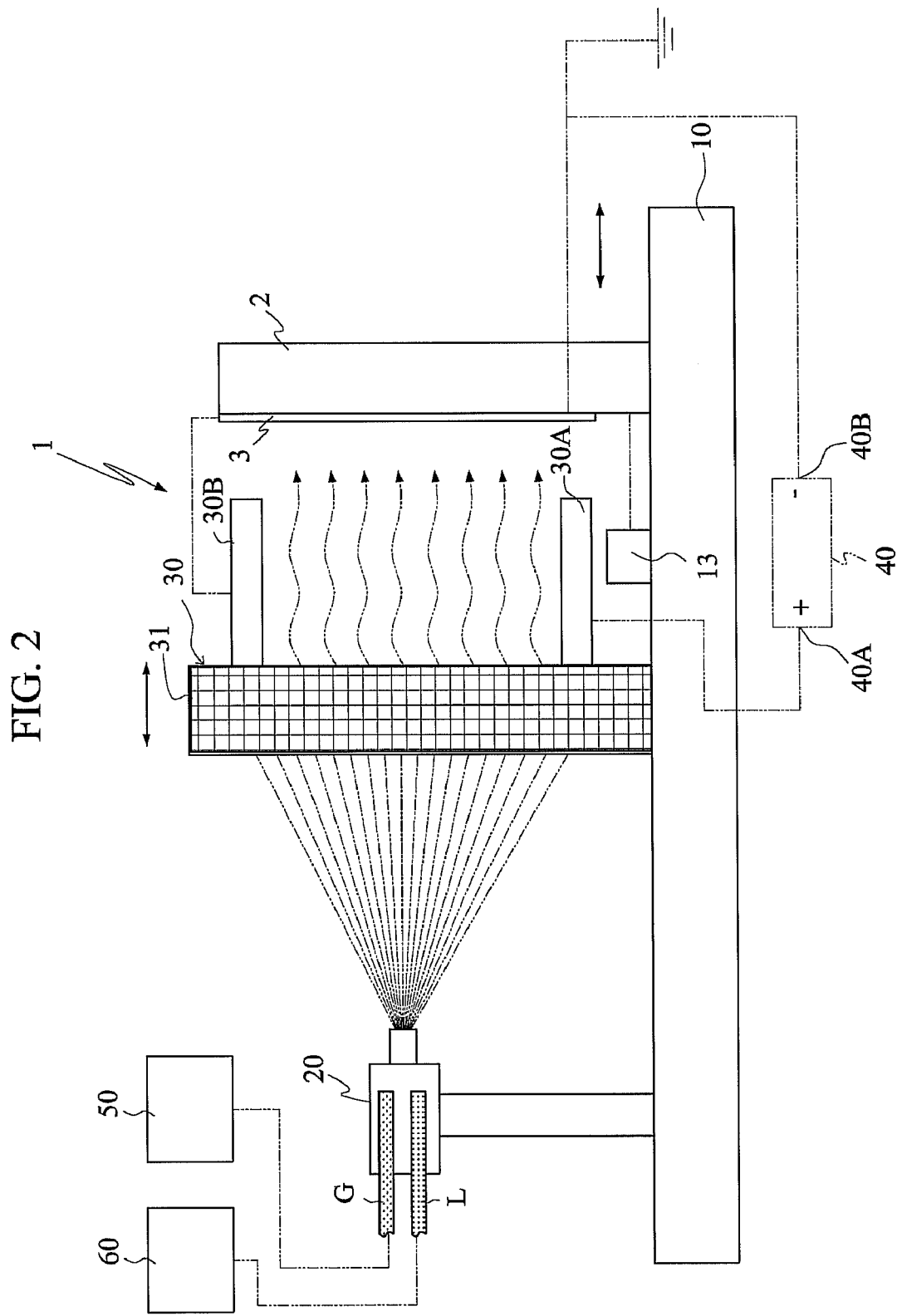
FIG. 2 is a schematic illustration showing an electrostatic coating apparatus according to a second embodiment of the invention.

FIG. 2 is a schematic illustration showing an electrostatic coating apparatus according to a second embodiment of the invention. As shown in FIG. 2, this embodiment is similar to the first embodiment except that the object 2' is a printed circuit board, which needs not to be rotated and can be directly mounted on the base module 10.

Figure 3:
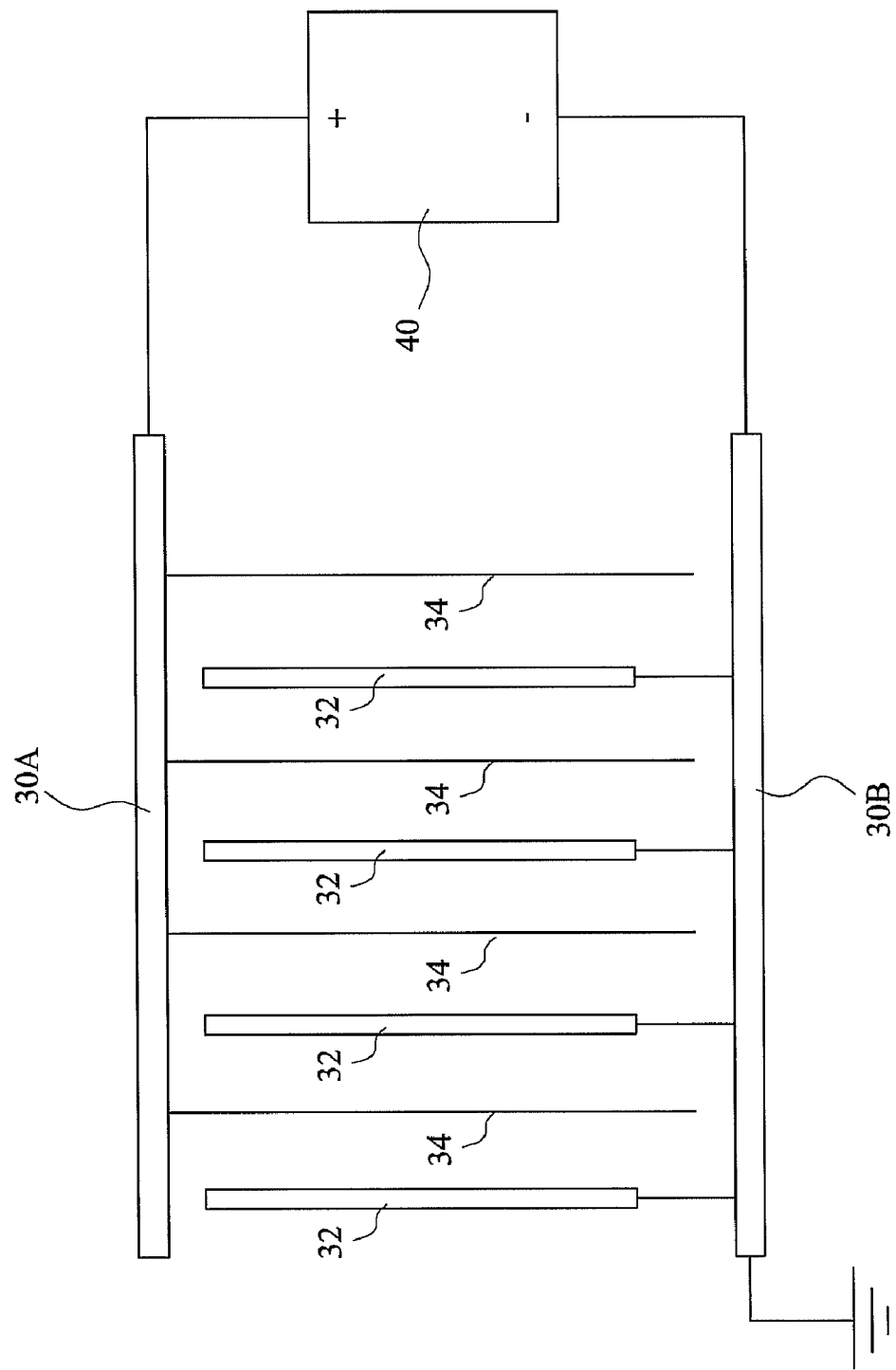
FIG. 3 shows an electric field generator and a power supply according to another example of the invention.

FIG. 3 shows an electric field generator and a power supply according to another example of the invention. Referring to FIG. 3, the electric field generator 30 includes a plurality of polar plates 32 and a plurality of wires 34. The polar plates 32 are electrically connected to the second pole 30B, and the wires 34 are electrically connected to the first pole 30A. The polar plates 32 are substantially parallel to the wires 34, and the polar plates 32 and the wires 34 are arranged alternately to form a plurality of sub-electric fields. Thus, the fog drops can be charged more efficiently, wherein the moving direction of the fog drops is perpendicular to the surface of the drawing sheet.

According to the electrostatic coating apparatus of the invention, the thickness of the coating layer can be controlled by controlling the electric field so that the uniformity of the coating layer can be enhanced. According to the invention, the high-quality coating layer can be formed so that the micro-structure can be manufactured or the transfer printing process can be performed. The micro-structure may be an optical device, such as a brightness enhancement film, a grating or a diffraction structure, or may be a mirror element. Regarding the transfer printing of the micro-structure, the size of the micro-structure can be reduced and the manufacturing cost of the micro-structure can be lowered.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An electrostatic coating apparatus for coating an object, the electrostatic coating apparatus comprising:
    a base module, on which the object is mounted;
    a nozzle for receiving gas and liquid, atomizing the liquid, and ejecting the gas and the liquid in the form of fog drops;
    an electric field generator, mounted on the base module and disposed downstream of the nozzle, for generating an electric field; and
    a power supply, wherein a first pole of the power supply is electrically connected to a first pole of the electric field generator, and a second pole of the power supply is electrically connected to the object and a second pole of the electric field generator such that the electric field is generated in the electric field generator and the fog drops passing through the electric field generator are charged and then absorbed onto the object to form a coating layer on the object.

2. The apparatus according to claim 1, wherein the base module comprises:
    a base; and
    a motor, wherein the object is mounted on the base through the motor, and the motor is coupled to the object to drive the object to rotate.

3. The apparatus according to claim 2, wherein the base module further comprises:
    a distance adjusting mechanism, coupled to the motor or the electric field generator, for adjusting a distance between the object and the electric field generator.

4. The apparatus according to claim 2, wherein the object is a roller and the coating layer is formed on a circumferential surface of the rotating roller.

5. The apparatus according to claim 1, wherein the base module comprises:
a distance adjusting mechanism, coupled to the object or the electric field generator, for adjusting a distance between the object and the electric field generator.

6. The apparatus according to claim 1, wherein the object is a conductor.

7. The apparatus according to claim 1, wherein the object is a roller, and a material of the roller comprises nickel or stainless steel.

8. The apparatus according to claim 1, wherein the first pole and the second pole of the electric field generator are respectively a first polar plate and a second polar plate, and the fog drops are moved between the first polar plate and the second polar plate.

9. The apparatus according to claim 1, wherein the power supply provides a direct current (DC) voltage.

10. The apparatus according to claim 1, wherein the liquid comprises a photoresist material.

11. The apparatus according to claim 1, wherein the gas comprises nitrogen or air.

12. The apparatus according to claim 1, wherein the electric field generator further has a mesh structure for atomizing the liquid.

13. The apparatus according to claim 1, wherein the electrostatic coating apparatus is configured such that a thickness of the coating layer is smaller than or equal to 30 nanometers.

14. The apparatus according to claim 13, wherein the thickness of the coating layer ranges between 20 and 30 nanometers.

15. The apparatus according to claim 1, wherein the second pole of the power supply is electrically connected to the second pole of the electric field generator through the object.

16. The apparatus according to claim 1, further comprising:
a gas supplying source, connected to the nozzle, for providing the gas; and
a liquid supplying source, connected to the nozzle, for providing the liquid.

17. The apparatus according to claim 1, wherein the object is a printed circuit board.

18. The apparatus according to claim 1, wherein the electric field generator comprises a plurality of polar plates and a plurality of wires, the polar plates are electrically connected to the second pole, the wires are electrically connected to the first pole, the polar plates are substantially parallel to the wires, and the polar plates and the wires are arranged alternately.

* * * * *